(12) United States Patent
Bachman

(10) Patent No.: US 9,748,431 B1
(45) Date of Patent: Aug. 29, 2017

(54) LARGE SCALE PRODUCTION OF PHOTOVOLTAIC CELLS AND RESULTING POWER

(71) Applicant: Eric C. Bachman, Oswego, IL (US)

(72) Inventor: Eric C. Bachman, Oswego, IL (US)

( * ) Notice: Subject to any disclaimer, the term of this patent is extended or adjusted under 35 U.S.C. 154(b) by 533 days.

(21) Appl. No.: 14/215,747

(22) Filed: Mar. 17, 2014

Related U.S. Application Data

(60) Provisional application No. 61/794,688, filed on Mar. 15, 2013.

(51) Int. Cl.
*H01L 31/18* (2006.01)
*H01L 31/20* (2006.01)
*H01L 31/05* (2014.01)

(52) U.S. Cl.
CPC .............. *H01L 31/18* (2013.01); *H01L 31/05* (2013.01); *H01L 31/206* (2013.01)

(58) Field of Classification Search
CPC .............................. H01L 31/18; H01L 31/206
See application file for complete search history.

(56) References Cited

U.S. PATENT DOCUMENTS

| | | | | |
|---|---|---|---|---|
| 4,134,387 A * | 1/1979 | Tornstrom | ............. | F24J 2/1052 126/684 |
| 6,168,851 B1 * | 1/2001 | Kubota | ................. | C09J 7/0242 156/285 |
| 6,808,670 B2 * | 10/2004 | Kawabe | ................. | C03B 37/011 264/433 |
| 7,615,256 B2 * | 11/2009 | Rickert | .................... | B05D 1/24 427/459 |
| 7,919,027 B2 * | 4/2011 | Nordlinder | ............. | B32B 38/10 156/248 |
| 8,187,982 B2 * | 5/2012 | Ishii | ...................... | H01L 31/188 257/E21.006 |
| 8,551,889 B2 * | 10/2013 | Ishii | ...................... | H01L 31/188 257/E21.077 |
| 9,171,991 B2 * | 10/2015 | Pearce | ............. | H01L 31/03928 |

OTHER PUBLICATIONS

"Thin Film Solar Cell", http://www.daviddarling.info/enclyclopedia/T/AE_thin_film_cell.html, Mar. 11, 2013.
"While you're up, print me a solar cell", by David L. Chandler, http://web.mit.edu/newsoffce/2011/printable-solar-cells-0711.html, Jul. 10, 2011.
"Organic Solar Cell", http://en.wikipedia.org/wiki/Organic_solar_cell, Mar. 11, 2013.
"Solar Cell", http://en.wikipedia.org/wiki/Low-cost_photovoltaic_cell, Mar. 11, 2013.
"Need Solar Energy? There's a Printer for That", by Chris Clark, http://www.kcet.org/news/rewire/solar/photovoltaic-pv/need-more-solar-cells-well-run-off . . . , May 23, 2013.

(Continued)

*Primary Examiner* — Evan Pert
(74) *Attorney, Agent, or Firm* — Calfee, Halter & Griswold, LLP

(57) ABSTRACT

The present application discloses systems and methods for manufacturing large PV sheets and conveying large PV sheets away from the PV manufacturing site while using power from the PV sheet to power the PV manufacturing site.

17 Claims, 11 Drawing Sheets

(56) References Cited

OTHER PUBLICATIONS

"New Machine can Print PV Solar Cells at a Rate of 10 Metres a Minute" by Joao Peixe, http://oilprice.com/Latest-Energy-News/World-News/New-Machine-can-Print-PV-Solar-C . . . , Jun. 3, 2013.

"Plexcore® PV Inks for Printed Solar Power", http://www.sigmaaldrich.com/technical-documents/articles/technology-spotlights/plexcore . . . , Mar. 17, 2014.

* cited by examiner

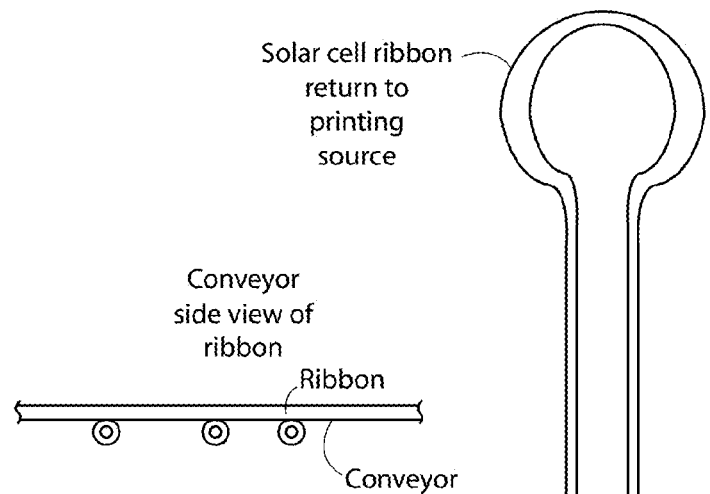
FIG. 1C
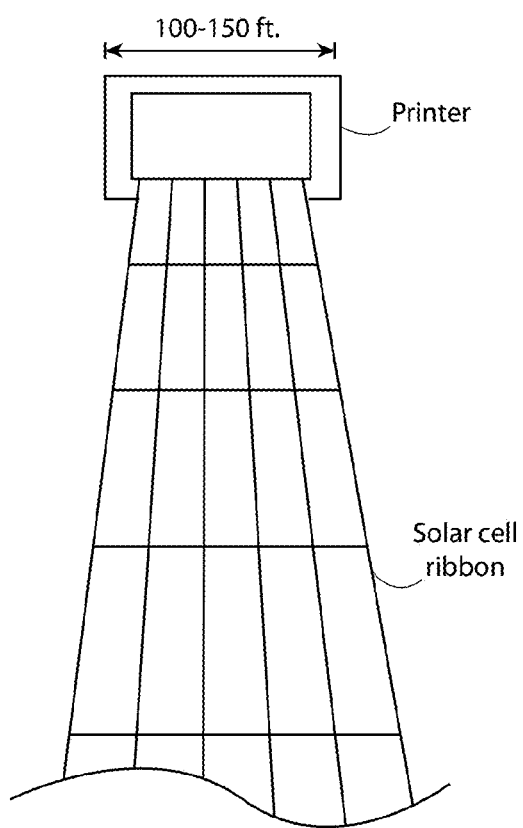
FIG. 1B
FIG. 1A

LARGE SCALE PRODUCTION OF PHOTOVOLTAIC CELLS AND RESULTING POWER

CROSS REFERENCE TO RELATED APPLICATIONS

This application claims priority to, and any other benefit of, U.S. Provisional Patent Application Ser. No. 61/794,688, filed on Mar. 15, 2013, and entitled LARGE SCALE PRODUCTION OF PHOTOVOLTAIC CELLS AND RESULTING POWER ("the '688 Application"), which application is hereby incorporated by reference in its entirety.

TECHNICAL FIELD

This invention relates to the production of photovoltaic cells and their production on a large scale.

BACKGROUND

The conventional production of solar or photovoltaic cells results in a thick, heavy combination of metal, glass and plastic that are called solar panels or solar cell panels. These solar panels often need some type of metal or concrete stand or framework to hold them at an optimum angle to the sun's light radiation. A photograph of a conventional solar panel "field" with concrete stands and framework is shown on page 1 of the document "Concept for a Modular Photovoltaic Printer," which is attached as Appendix 1 to the '688 Application, which is incorporated herein by reference in its entirety. Conventional solar panels cannot be produced on a large scale in an economic or efficient manner. Further, the mounting and installation of such panels on framework and stands is expensive and time consuming. In addition, to replace all electricity generated by fossil fuels (117,076 TWH) it would require photovoltaic cells having an area of about 100,000 square miles. To even approach this amount of photovoltaic cell production, the embodiments described herein will be needed.

SUMMARY

Recently, thin film photovoltaic cell technology has been developed. This thin film technology results in a thin photovoltaic cell that can be 1-10 microns thick and can effectively be printed on a thin substrate like paper, plastic or cloth in multiple layers. The embodiments of this invention provide for the delivery of these thin, printed photovoltaic cells on a large scale.

BRIEF DESCRIPTION OF THE FIGS.

FIG. 1A is a front schematic view of a large photovoltaic ("PV") printer and a wide, flat and continuous array of solar cells that has been printed by the PV printer;

FIG. 1B is a top schematic view of a distal turnaround for a wide, flat and continuous array of solar cells and a conveyor of a horizontal first embodiment moving the wide, flat and continuous array of solar cells away from the PV printer, around the turnaround, and back to the PV printer for re-printing, refurbishing, and/or recycling;

Figure 2:
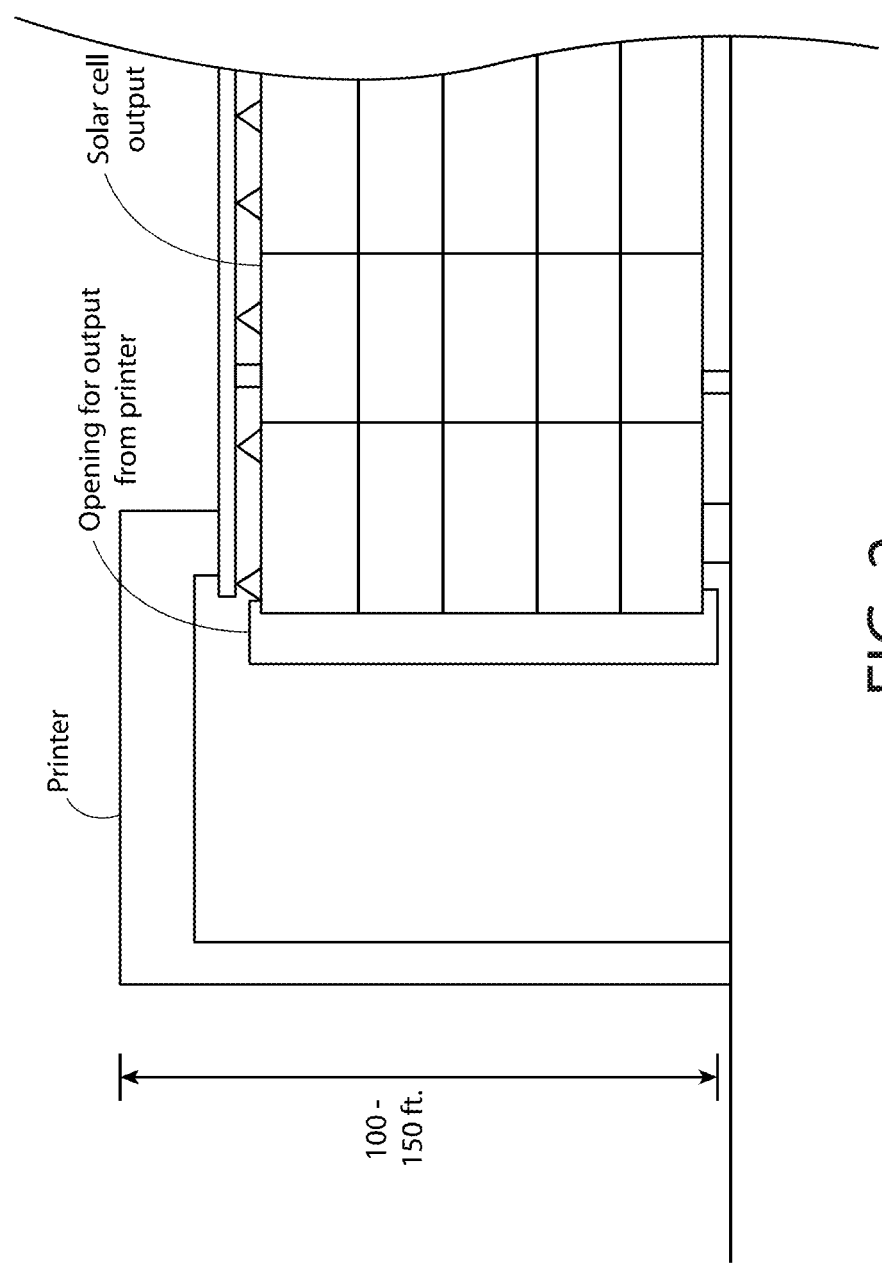
Figure 3:
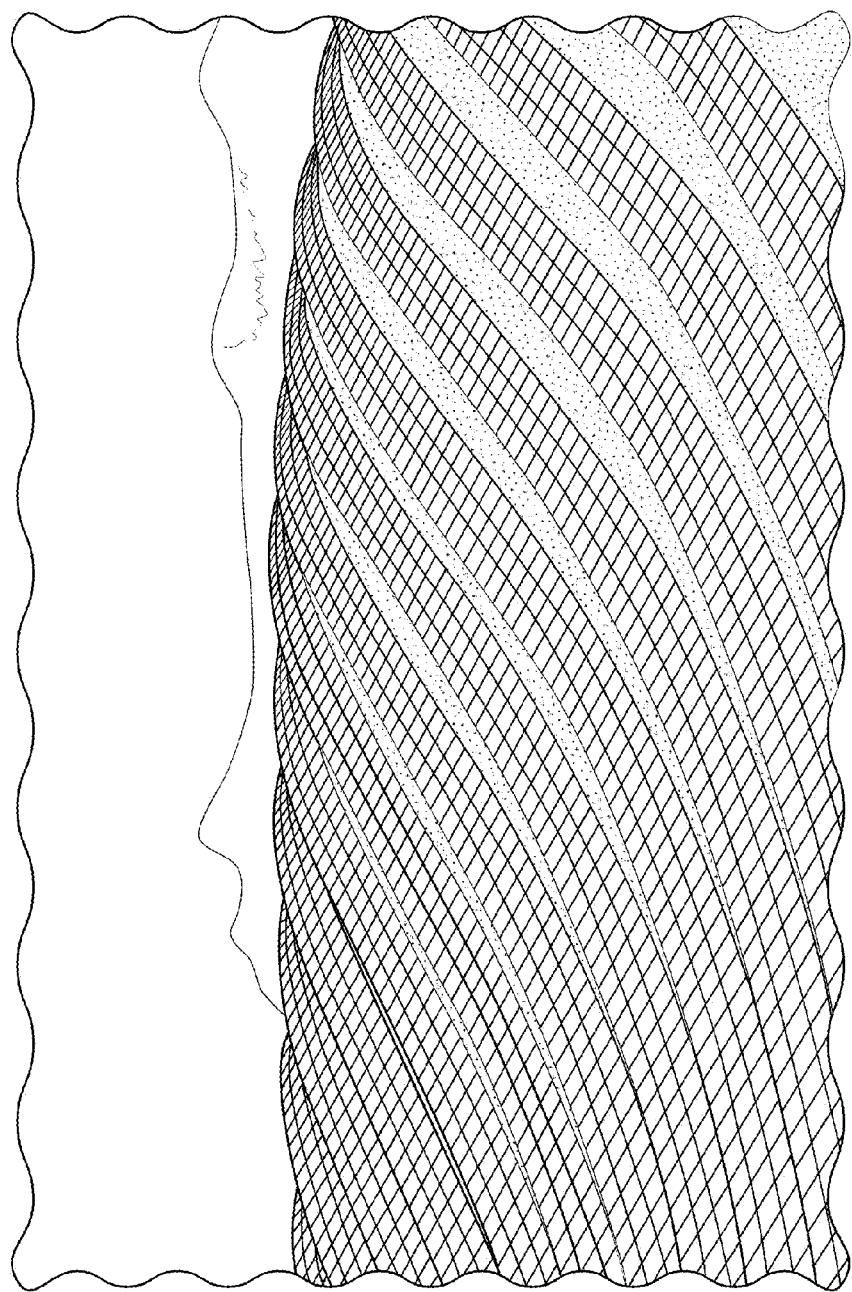
Figure 4:
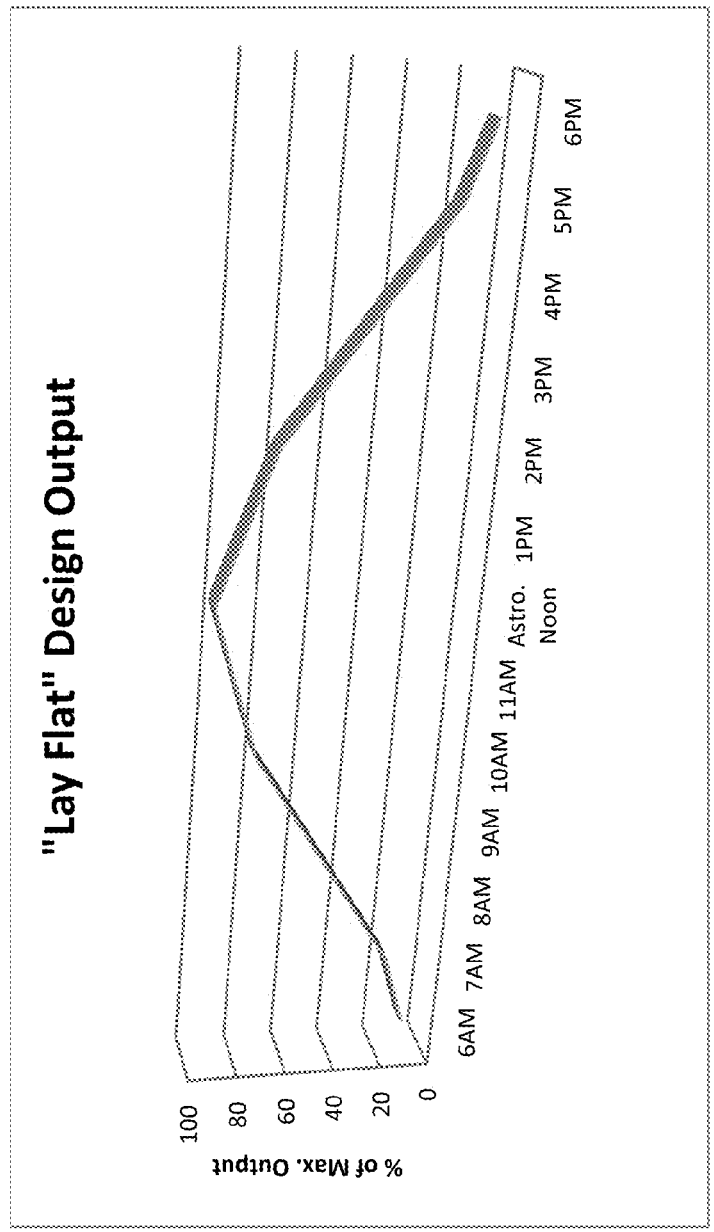
Figure 5:
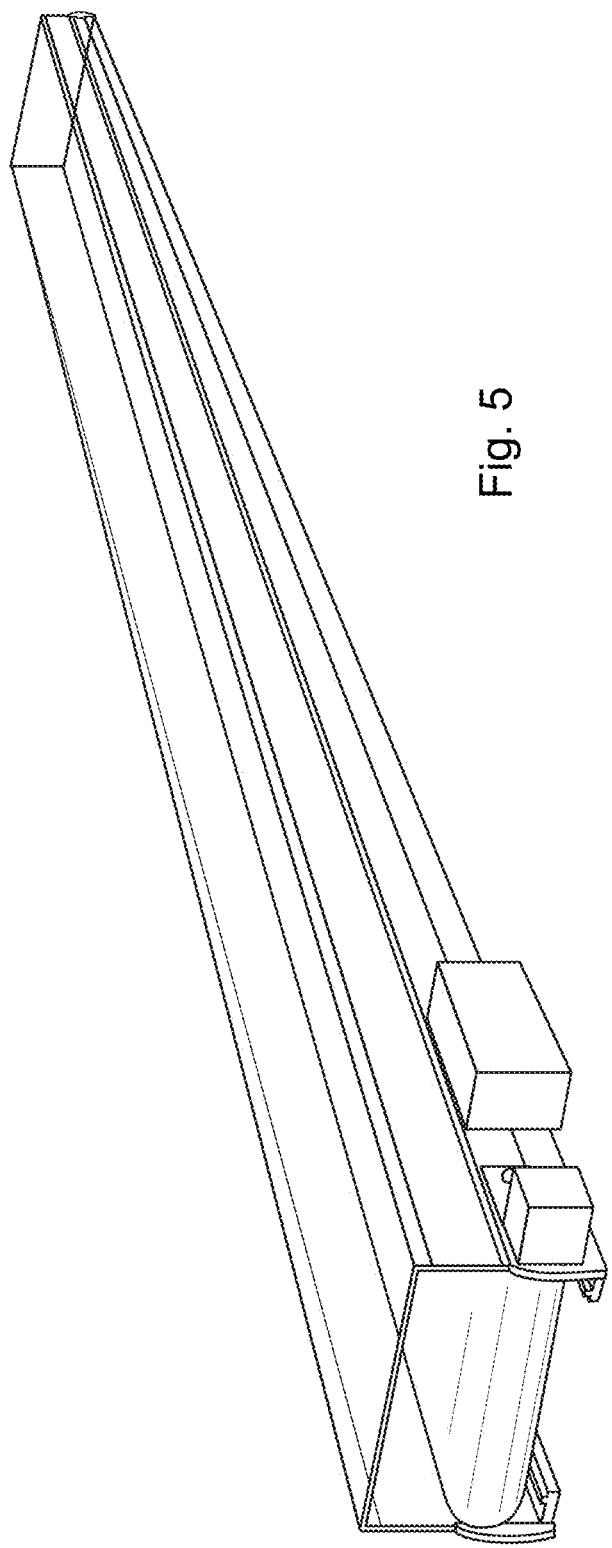
Figure 6:
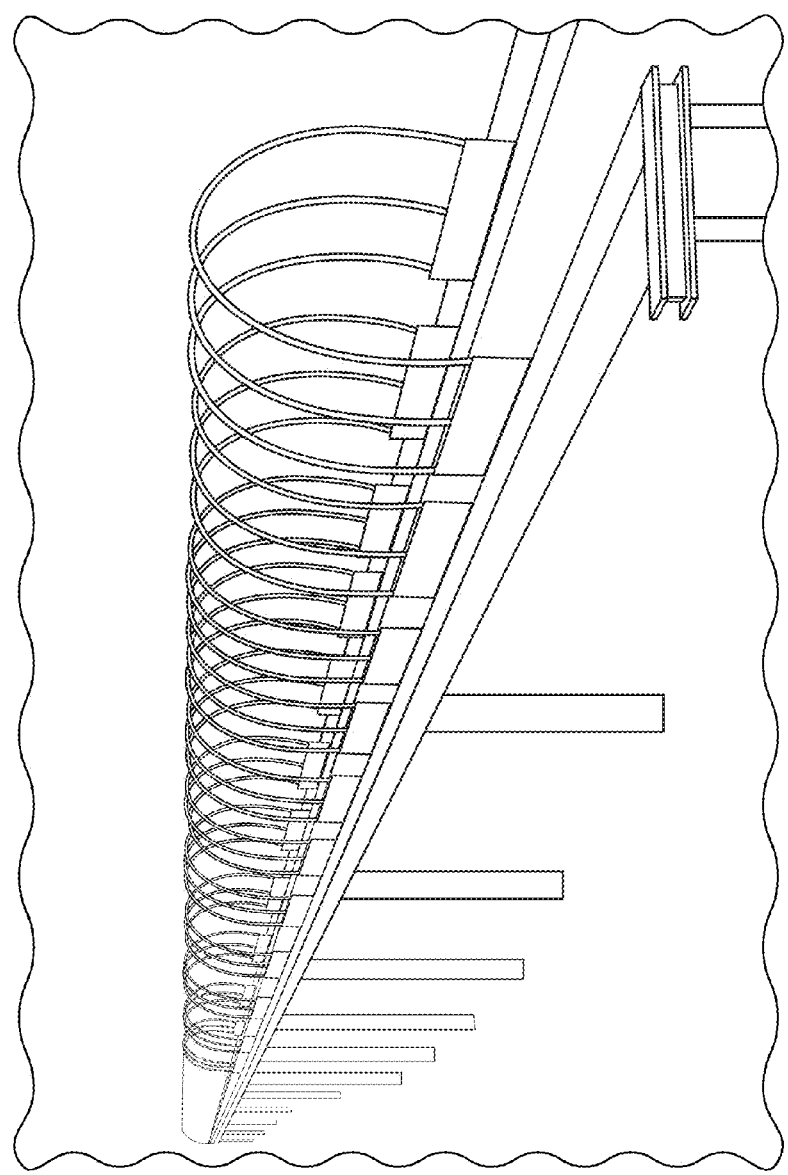
Figure 7A:
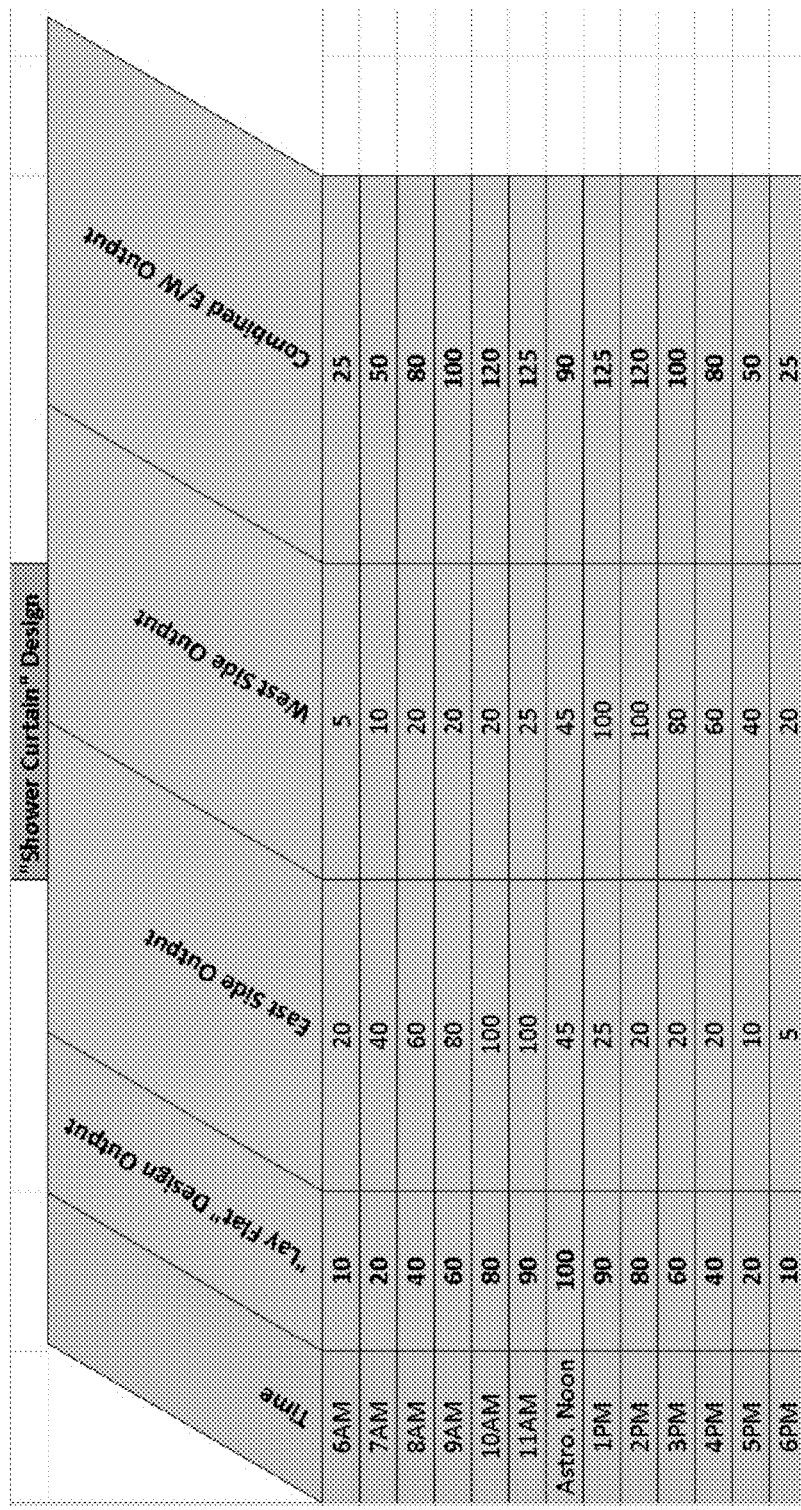
Figure 7B:
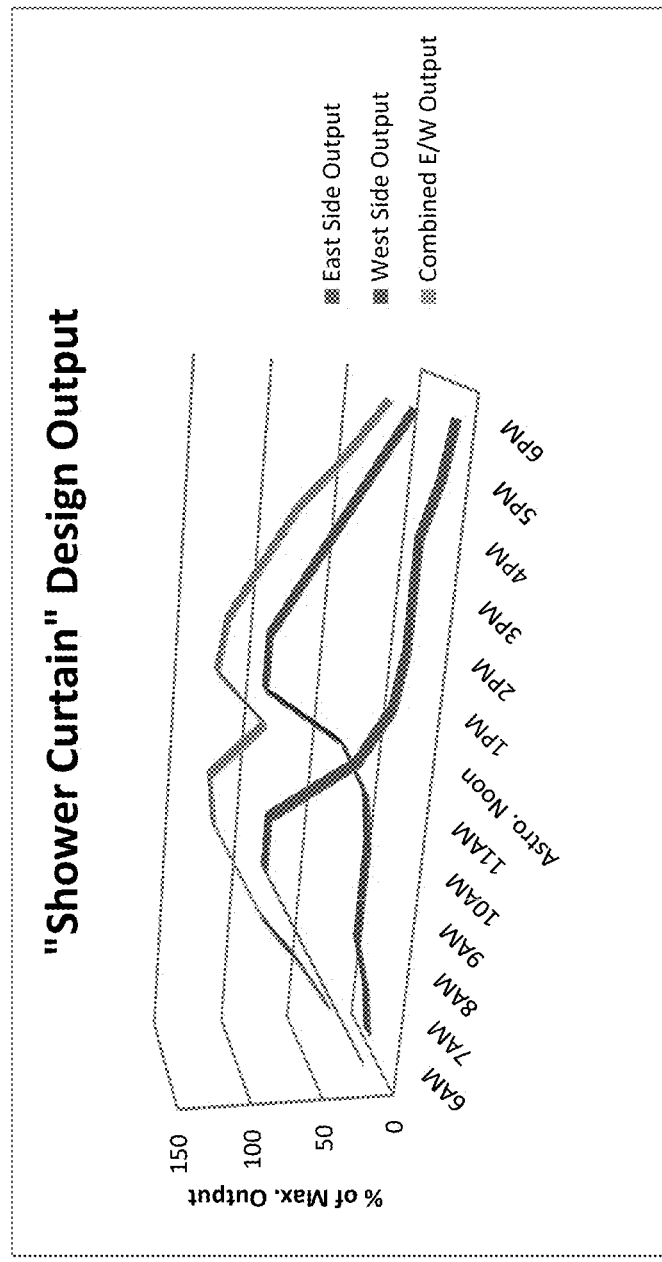
Figure 8A:
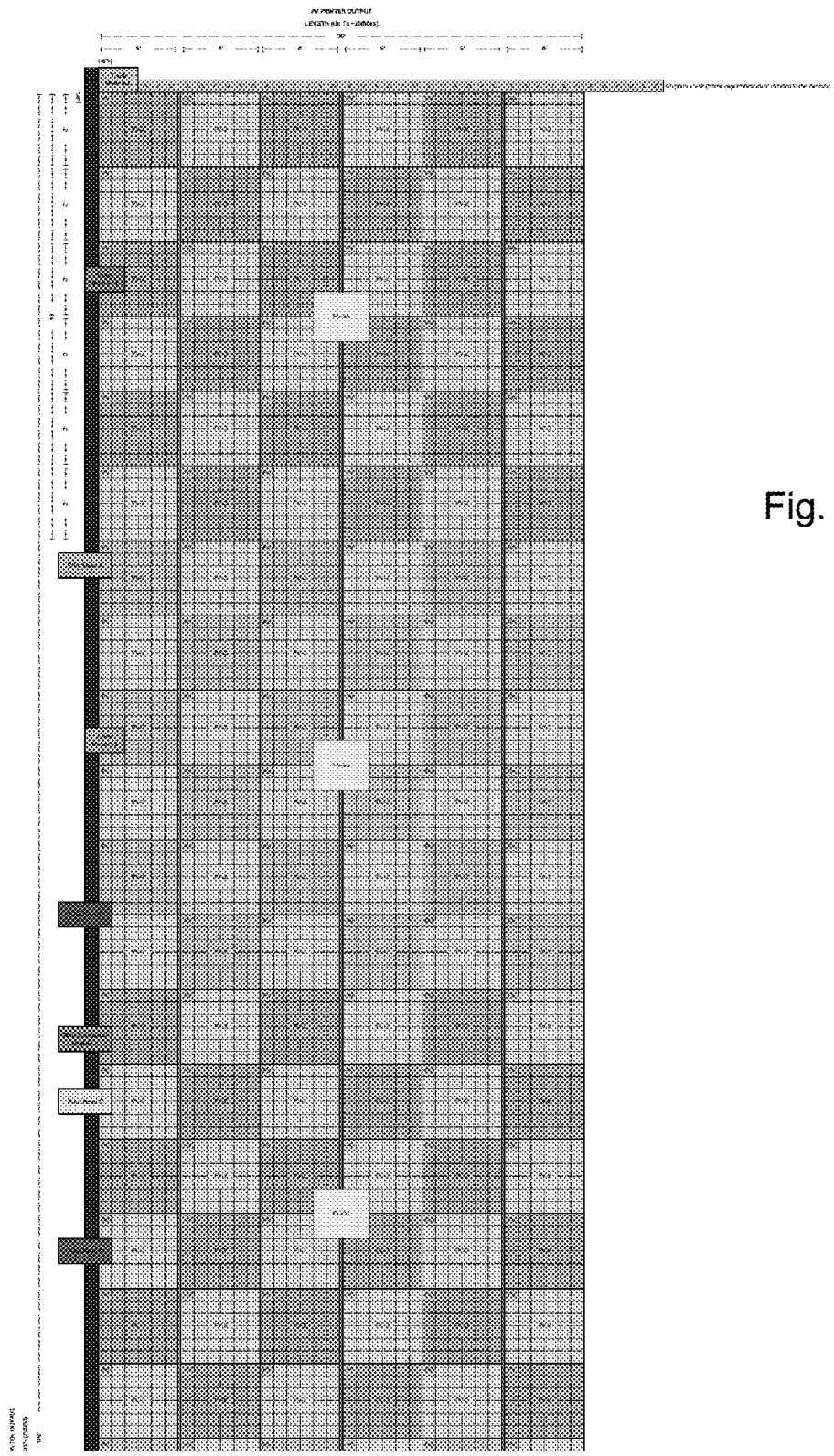
Figure 8B:
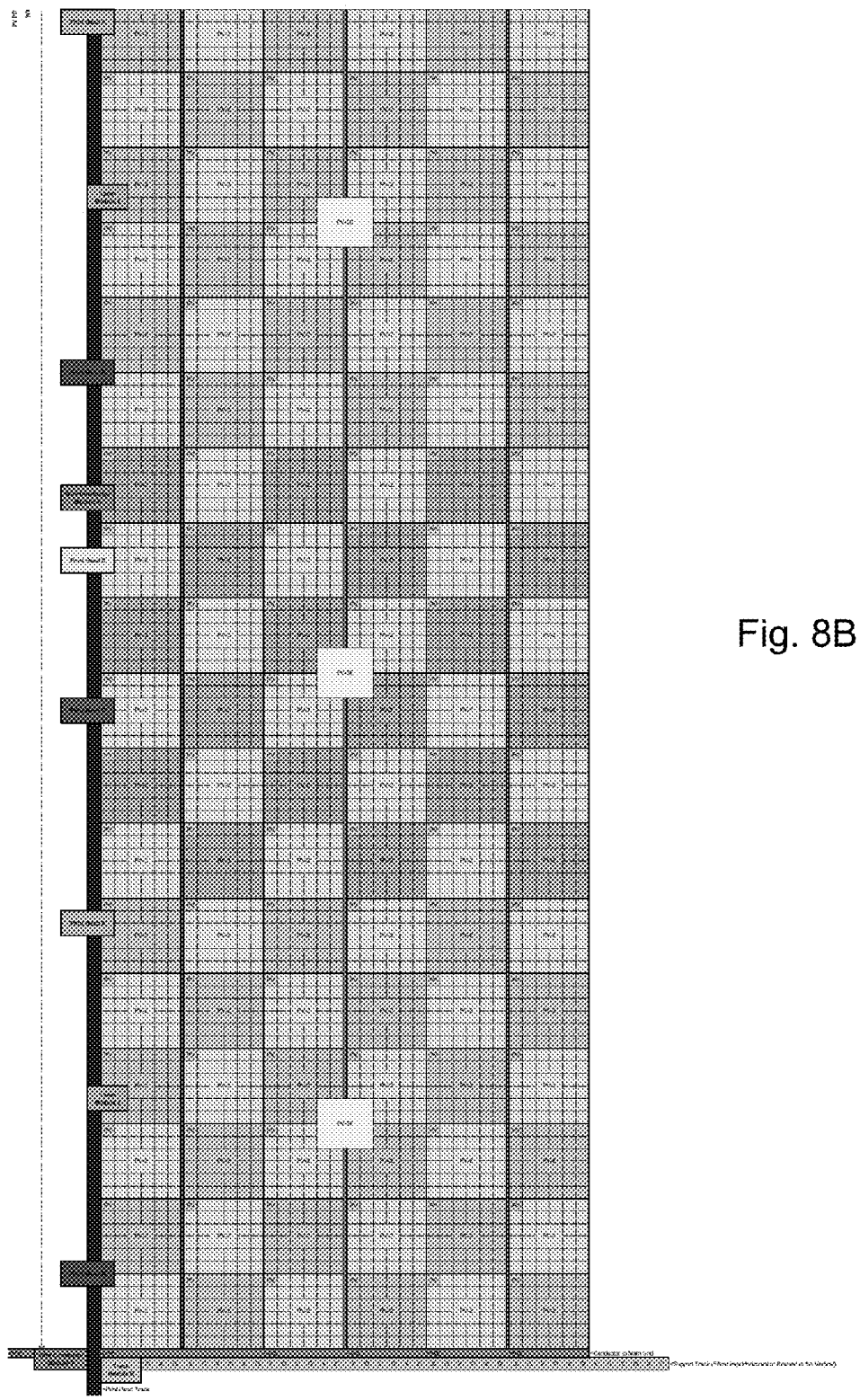
Figure 9:
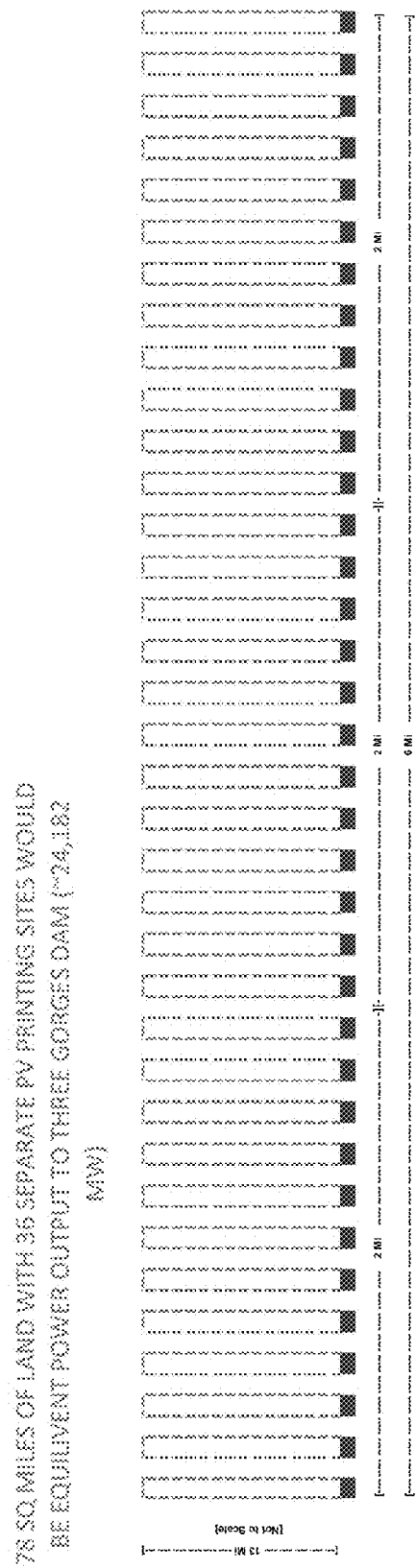

FIG. 1C is a side elevational schematic representation of a wide, flat and continuous array of solar cells of the horizontal first embodiment, showing the wide, flat and continuous array of solar cells (ribbon) and rollers of a conveyor moving the wide, flat and continuous array of solar cells away from the PV printer and, optionally, back to the PV printer for re-printing, refurbishing, and/or recycling;

FIG. 2 is a side elevational schematic view of a large PV printer and a wide, flat and continuous array of solar cells that has been printed by the PV printer in a vertical orientation according to a second embodiment;

FIG. 3 shows exemplary PV ribbons (long, wide, flat and continuous arrays of solar cells);

FIG. 4 shows exemplary electrical power output for an exemplary horizontal embodiment normalized to noon-day output;

FIG. 5 shows an exemplary encapsulated lay flat (horizontal) embodiment conveyor for moving the wide, flat and continuous array of solar cells away from the PV printer and, optionally, back to the PV printer for re-printing, refurbishing, and/or recycling;

FIG. 6 shows another exemplary lay flat (horizontal) embodiment conveyor for moving the wide, flat and continuous array of solar cells away from the PV printer and, optionally, back to the PV printer for re-printing, refurbishing, and/or recycling;

FIGS. 7A-7B show exemplary electrical power output for an exemplary two-sided vertical embodiment normalized to noon-day output;

FIG. 8 (consisting of FIGS. 8A-8B, with FIG. 8A above FIG. 8B) is a schematic representation of PV cells arrayed on the substrate sheet; and FIG. 9 shows a schematic top view of a system of 36 separate, proximate, parallel PV printing sites and track systems in a single location.

DESCRIPTION

This Detailed Description merely describes exemplary embodiments of the invention and is not intended to limit the scope of the claims in any way. Indeed, the invention as claimed is broader than and unlimited by the preferred embodiments, and the terms used in the claims have their full ordinary meaning, unless an express definition is provided herein.

Exemplary embodiments of the invention result in a long, wide, flat and continuous "ribbon" of arrayed photovoltaic cells that lays flat on a conveyor or track (i.e., substantially horizontally). This horizontal embodiment is depicted in FIGS. 1A, 1B and 1C. In other exemplary embodiments (e.g., FIG. 2) the wide, flat and continuous array of solar cells is suspended substantially vertically. As can be seen in FIG. 1A, a very large printer that is approximately 100-150 feet wide and 100-150 feet long prints out a wide, flat and continuous array of solar cells. The large printer has several print heads or nozzles. These nozzles or print heads are arranged in succession and each prints a different, very thin layer (less than one micron) of material that each comprises a different layer of the thin film solar cells. For example, in one embodiment the large printer may have six print heads because the solar cells being produced are comprised of six different layers of material. Other solar cells may be comprised of seven or eight layers, and in these embodiments the printer would have seven or eight layers, respectively.

One exemplary type of thin film solar cell as described in Appendix 2 to the '688 Application, which is incorporated herein by reference in its entirety, has six layers on a substrate, which can be paper or a carbon/graphite cloth. The six layers are a back contact comprised of a conductive polymer, a P-type Semiconductor Material, an N-type semiconductor material, a front contact which is again a conductive polymer, a protective coating and an anti-reflective coating. In this case, six print heads would be used, one for each material applied in succession on the substrate.

Other exemplary printable thin film solar cells are described in the Appendices to the '688 Application, which is incorporated herein by reference in its entirety. An additional exemplary printable thin film solar cell is described in the following, which is incorporated herein by reference in its entirety (and shown on an accompanying IDS):

Plexcore® PV Inks for Printed Solar Power
http://www.sigmaaldrich.com/technical-documents/articles/technology-spotlights/plexcore-pv-ink-system-.html.

Exemplary thin film solar cell printers for printing PV sheets and PV ribbons used herein are described in the following, which are incorporated herein by reference in their entireties (and shown on an accompanying IDS):

http://oilprice.com/Latest-Energy-News/World-News/New-Machine-can-Print-PV-Solar-Cells-at-a-Rate-of-10-Meters-a-Minute.html;

http://www.kcet.org/news/rewire/solar/photovoltaic-pv/need-more-solar-cells-well-run-off-a-few-hundred-for-ya-mate.html.

The normal, best location for this embodiment is a desert or any other location that has a great deal of clear, sunny days, e.g., sunny, rare cloud, high elevation, long-day geographical regions would be best but any geographical location (within reason) would be acceptable to a greater or lesser extent. The printer would begin to produce the printed thin film solar cell ribbon and immediately produce power at the start. The solar cells are then connected to the conventional power grid as they continue to print through the contact layers of the solar cells. With 2013 technology of thin film solar cells, it is estimated that the printer would create at least 12 inches of solar cells per day that are about 100 feet wide. At this rate, in fifteen years a one mile length of thin film solar cells would be produced. It is estimated that the printer would be a net user of electricity from the power grid until the solar cell ribbon is long enough such that it would become a net producer of electricity. It is estimated that this embodiment would become a net producer as opposed to a consumer of electricity in about 6 months.

This flat embodiment would have maximum efficiency at noon or the high point of the sun in the day and lay flat on a conveyor or track as shown in FIG. 1C. It could be rerouted back to the printer by turning the conveyor in a tear drop shape (see FIG. 1B). This rerouting could occur at any place on the ribbon length, but in exemplary embodiments is after about 15 years of production and then reroute the ribbon back to the printer where its useful life would conclude as a solar cell and it could be re-printed, refurbished, and/or recycled. One embodiment would have the ribbon rerouted back to the printer on an elevated conveyor or different plane than the first ribbon of thin film photovoltaic cells. Exemplary resulting ribbons from this lay flat (horizontal) embodiment are depicted in FIG. 3. FIG. 4 shows exemplary power output for an exemplary vertical embodiment normalized to noon-day output. In exemplary "lay flat" (horizontal) embodiments, the wide, flat and continuous array of solar cells is stretched across the two edges (left and right) between solid walls of sheet steel, plastic or composite material (to prevent wind from entering up from below) that are elevated (e.g., 1-6 feet high) off the ground. In exemplary flat, horizontal embodiments, a clear, thin membrane is suspended above the printed PV fabric that is either easily replaced or cleaned when it becomes dirt ridden, clouded or otherwise damaged by UV rays. One advantage of this design is that delicate printed PV fabric is encapsulated and protected from the elements. FIGS. 4 and 5 show exemplary conveyors for this flat, horizontal embodiment. FIG. 4 is an exemplary encapsulated lay flat embodiment, in which a motor with a motor controller moves the wide, flat and continuous array of solar cells away from the PV printer. FIG. 5 is another exemplary encapsulated lay flat embodiment, in which a motor with a motor controller moves the wide, flat and continuous array of solar cells away from the PV printer. In other exemplary embodiments, an optional additional length of either type of the conveyor moves the wide, flat and continuous array of solar cells back to the PV printer (e.g., back to the building or other enclosure where the PV printing takes place) for re-printing, refurbishing, and/or recycling (FIG. 1B). In FIG. 4, the clear, thin membrane is positioned and suspended all around the printed PV fabric longitudinally (obviously the proximal end needs to be open to accept the printed PV fabric from the PV printer). In FIG. 5, bowed strips of clear material protect all of or portions of the printed PV fabric (optionally there can be gaps between the bowed pieces of material).

In another exemplary embodiment the printer prints out a vertical sheet of thin film solar cells on a substrate. In this embodiment the thin film solar cells could be printed on both sides of the substrate. Accordingly, in this embodiment the number of print heads or nozzles required to print the substrate would be twice the amount required to print a single sided substrate. For example, if six heads are required to print one type of thin film solar cell with six layers, then for the two sided embodiment 12 print heads will be required—six for each side.

In this vertical solar cell sheet embodiment, the sheet would be attached to an elevated track or pipe as shown in FIG. 2 and hug from the elevated track in a vertical orientation. The sheet would continue to be attached to the elevated track as it is produced so that a very long sheet of PV printed substrate is hung and generates power. In this embodiment, the noontime sun would produce the lowest power output, but power production would be more consistent or level throughout the entire day. That is, In this design, the double-sided printing allows for direct sunlight on one side half the day and indirect sunlight on the alternate side for the same period. At astronomical noon, both sides would be in indirect sunlight—albeit bathed in intense indirect light. After astronomical noon, the flip side would now be in direct sunlight while the alternative side is now in indirect sunlight. This vertical embodiment may in some circumstances preferable over the horizontal design because output is relatively constant throughout the day from just after sunrise to just before sunset. Therefore, contribution by the solar cells to the grid would be somewhat stable and of high duration. The vertical embodiment also would be far less affected by sand, dirt, droppings, etc. One potential issue with the vertical design is wind, but strong attachments of the PV sheet at the top allowing the PV sheet to hang free at the bottom (it can be weighted) will prevent a possible "sail" effect that could potentially take down the support track or rip the mounting (like it could if the PV sheet is attached at both top and bottom). FIGS. 7A-7B show exemplary power output for an exemplary vertical embodiment normalized to noon-day output. A comparison of FIG. 4 with FIGS. 7A-7B shows that the vertical embodiment has electrical output that is more consistent or level throughout the entire day vis-à-vis the horizontal embodiment.

This vertical embodiment has been called a "shower curtain" embodiment because the thin film solar cells would hang vertically like a shower curtain. It could also optionally return after a certain length of track back to the printer for re-printing, refurbishing, and/or recycling. If both sides of the sheet are PV printed, the tracks would be spaced far enough apart that they do not cast a significant shadow on each other, e.g., for a 100' high vertical sheet, a spacing of 300-700 feet, e.g., 500 feet can be used.

In exemplary embodiments, the elevated track for the vertical design are either wire rope or tubular steel construction.

In both horizontal and vertical exemplary embodiments, the PV printed fabric is outfitted with the necessary mounting hardware (depending on flat or shower curtain) after being printed and is then routed to the conveyor or support track for final mounting and routing.

In yet other exemplary embodiments, the substrate is woven (or otherwise manufactured) at the sight of the printer from carbon fiber yarn into the substrate, which would ease the transportation and handling of the carbon fiber and large spools of carbon fiber (approximately 100 feet long, with a 100-foot wide length of material wound thereon—or any of the sheet widths described herein).

In exemplary embodiments, the width of the substrate and thus the width of the wide, flat, and continuous array of solar cells (i.e., the ribbon or sheet of photovoltaic cells) is ≥25 feet, or is ≥50 feet, or is ≥75 feet, or is ≥100 feet, or is ≥150 feet, or is ≅200 feet. Thus, in exemplary embodiments, the width of the substrate and thus the width of the wide, flat, and continuous array of solar cells is 50-200 feet or 100-200 feet, or 100-150 feet or 150-200 feet. In the shower curtain embodiment, the track or pipe to which the sheet of photovoltaic cells is suspended will be high enough that the bottom of the sheet of photovoltaic cells does not touch the ground or other In exemplary embodiments, the length of the substrate and thus the width of the wide, flat, and continuous array of solar cells (the "ribbon" or "sheet" of photovoltaic cells) is ≥ a half-mile, or is ≥one mile, or is ≥5 miles, or is ≥10 miles, or is ≥15 miles, or is ≥20 miles, or is 0.5-20 miles or 1-20 miles or 5-20 miles or 10-20 miles. In exemplary embodiments, the turnaround is located at about the half-life point (half of the useful life) of the solar cells. As the useful life increases, the turnaround can be moved further out.

In exemplary embodiments, a continuous fabric underlayment (substrate) has printed PV subpanels that make up interconnected subpannel-2s, -3s, -4s, etc. These printed subpanels are printed indefinitely to an ultimate length of 1 or 5, 10, 15, 20 miles (the lengths discussed above) then routed back or underneath returning to the printer to be re-printed, refurbished, or In exemplary embodiments, the printed PV sheets consist of small discrete, individual subpanels of the largest size (e.g., a number of inches or a number of centimeters, e.g., 6" sq.) permitted at that time by design factors such as efficiency, manufacturing processes, material properties, cost, etc. An exemplary implementation of this is shown schematically in FIG. 8. As shown in that Figure, a number of these, e.g., perhaps 36 of these, individual, printed subpanels would be, firstly, interconnected through, most likely, integrated printed circuits in series into a subpanel-2. Each of these subpanel-2s would be, secondly, interconnected through, most likely, larger integrated printed circuits again in series into a subpanel-3. This would go on and on until the width of the substrate was fully utilized (i.e. about 100 ft or whatever sheet width is desired). Each subpanel-x would be interconnected in series until optimal operational voltage was achieved. At this point, each subpanel-x+1 would then be interconnected in parallel to achieve maximum obtainable current. Integrated printed circuits would be utilized (and would be preferable) until the design limitation (i.e. efficiency, manufacturing processes, material properties, cost, etc.) of these circuits was reached and then outboard wiring of increases conductor gauge size would become necessary. This outboard wiring, most likely, could be automated and this conductor would be what, eventually ties into the established electrical grid entering at the printer building. Therefore, the width if the printed PV fabric would be what achieves optimal voltage (of course, with some length as a corresponding factor) whereas printed length (100 ft, 1,000 ft, 1 mile, 10 mile, etc., as discussed above) would determine maximum output current. So a system that has had time to "print" 2 miles of PV would have nominal current of approximately 2× a system that has only had time to print 1 mile of PV. Both, however, would operate at the same optimal operational voltage, despite their length.

In exemplary embodiments, the following methodology used:
Connect the printer and building housing the printer to the electrical grid;
The printer, track system, and associated circuits and communications are powered by the electrical grid;
Continuously print PV sheet (as long as printing conditions are met, e.g., all PV inks are available, grid power is available, and there is sufficient buffer room in the building or sufficient empty track to accept newly printed PV ribbon);
Continuously or intermittently convey printed PV ribbon to its track (horizontal or vertical);
Route power from sun-exposed PV sheet to power the printer, track system, and associated circuits and communications while it is being generated;
  While printing, and while the PV sheet provides insufficient power (e.g., at night, or on cloudy days, or while the PV sheet is relatively small), use grid power to power the printer, track system, and associated circuits and communications;
  While not printing, e.g., when printing conditions are not met, route power from sun-exposed PV sheet to the grid; and
  While printing, and while the PV sheet provides sufficient power, use PV sheet-generated power to power the printer, track system, and associated circuits and communications and route excess power to the grid.

In exemplary embodiments, printing and roll-out of the printed PV fabric is to be designed to utilize automation to the greatest extent possible. In exemplary embodiments, the tracks (either "shower curtain" or "lay flat") extend either directly South or directly North (or substantially South or Substantially North) away from the printer/building, e.g., on an optimal route South (or North), taking into account geography, property rights, environmental concerns, etc. This track would eventually extend miles (or many miles) out from the printer building. In exemplary embodiments, the track system (either "shower curtain" or "lay flat") is installed manually, as needed. For example, segments of track system can be added to the distal end as the distal end of the printed PV sheet extends to that distal end of the track; one simply must be ahead of the printer so the printer can print continuously.

If A sheet or ribbon can be formed from one or multiple rolls of substrate. If substrate rolls shorter than the final length are used, eventually a roll of substrate will end and must be joined end to end to the beginning of another roll. The joined substrates form a single sheet or ribbon as that term is used herein.

FIG. 9 shows schematically that 78 sq miles of land with 36 separate PV printing sites would be equivalent power output to three dams like Gorges Dam (~24,182 mw).

The embodiments described herein are only exemplary and not intended to limit the scope or language of any future claims in any way which will have all of their full ordinary meanings. While the present invention has been illustrated by the description of embodiments thereof, and while the embodiments have been described in considerable detail, it is not the intention of the applicants to restrict or in any way limit the scope of the invention to such details. Additional advantages and modifications will readily appear to those skilled in the art. For example, the track need not be a simple out and back configuration; a single track can zig-zag back and forth away from the printer and optionally back to the printer. As another example, although organic ink printed PV substrates are discussed herein, the application is not limited to organic ink PV printers or PV printers in general or even PV printed substrates. Many benefits of the present application would be obtained by attaching traditional thin film photovoltaic cells (e.g., multijunction PV cells (2-terminal, monolithic)[1], single junction GAAs PV cells[2], crystalline Si PV cells[3], thin film technology PV cells[4], and/or printed PV cells[5]) (with adhesive or fasteners or into transparent pocket in the substrate or other connection means) on a wide, flat and continuous substrate to form a wide, flat and continuous array of solar cells (also PV ribbons and PV sheets) using any of the related systems and methods herein (e.g., horizontal track, vertical track, power methods, powering the manufacturing site by the manufactured PV ribbon or PV sheet in sunlight, etc.). In this broader context, the terms PV ribbons and PV sheets can mean any of these technologies and the term PV printer throughout can be thought of as a manufacturing site. As yet another example, the steps of all processes and methods herein can be performed in any order, unless two or more steps are expressly stated as being performed in a particular order, or certain steps inherently require a particular order. Therefore, the inventive concept, in its broader aspects, is not limited to the specific details, the representative apparatus, and illustrative examples shown and described. Accordingly, departures may be made from such details without departing from the spirit or scope of the applicant's general inventive concept.

[1] E.g., lattice matched, metamorphic, inverted metamorphic, three junction (concentrator), three junction (non-concentrator), two junction (concentrator), two junction (non-concentrator), 4 or more junction (concentrator), or 4 or more junction (non-concentrator) PV cells.

[2] E.g., single crystal, concentrator, or thin film crystal PV cells.

[3] Single crystal (concentrator), single crystal (non-concentrator), multicrystalline, thick Si film, silicon heterostructures (HIT), or thin-film crystal PV cells.

[4] E.g., CIGS (concentrator), CIGS, CdTe, Amorphous Si:H (stabilized), nani-Si, micro-Si, poly-Si, or multi junction polycrystalline PV cells.

[5] E.g., dye-sensitized cells, Perovskite cells, organic cells, organic tandem cells, inorganic cells (e.g., CZTSSe), quatum dot cells, or any of the other embodiments herein PV cells.

What is claimed is:

1. A method, comprising:
   a. providing a PV printer and associated track system for conveying a printed PV sheet away from the PV printer and into a sun-lit area;
   b. powering the printer and associated track system by an electrical grid;
   c. as long as printing conditions are met, printing the PV sheet;
   d. continuously or intermittently conveying a printed PV ribbon to an associated track (horizontal or vertical) to convey the printed PV sheet away from the PV printer and into a sun-lit area;
   e. routing power from the sun-exposed PV sheet to power the PV printer and track system while the PV sheet it generates power;
   f. while printing, and while the PV sheet provides insufficient power to power the PV printer and the track system, using grid power to supplement the power to the PV printer and track system;
   g. while not printing, routing power from sun-exposed PV sheet to the grid; and
   h. while printing, and while the PV sheet provides sufficient power to power the PV printer and the track system, using PV sheet-generated power to power the printer, track system, and associated circuits and communications and routing excess power from PV sheet.

2. The method according to claim 1, wherein the PV sheet is 50-200 feet wide.

3. The method according to claim 1, wherein substrate for the PV sheet is 500 feet to 20 miles long.

4. The method according to claim 1, wherein the PV sheet is 500 feet to 20 miles long.

5. The method according to claim 1, wherein the PV sheet track system hangs the PV sheet substantially vertically in the sun-lit region and permits the distal end of the PV sheet and already-printed PV sheet to move away from the PV printer as additional substrate is PV printed and conveyed into the sun-lit region.

6. The method according to claim 5, wherein the track system turns at a distal end to convey the PV sheet back to the PV printer while still exposed to the sun in the sun-lit region.

7. The method according to claim 1, wherein the PV sheet track system supports the PV sheet in a substantially horizontal orientation in the sun-lit region and permits the distal end of the PV sheet and already-printed PV sheet to move away from the PV printer as additional substrate is PV printed and conveyed into the sun-lit region.

8. The method according to claim 7, wherein the track system turns at a distal end to convey a wide, flat and continuous array of solar cells back to the PV printer while still exposed to the sun in the sun-lit region.

9. A method, comprising:
   a. providing a PV manufacturing site configured to manufacture PV cells and affix the PV cells onto a wide, flat and continuous substrate to form a wide, flat and continuous array of solar cells;
   b. providing an associated track system for conveying the wide, flat and continuous array of solar cells away from the PV manufacturing site and into a sun-lit area;
   c. powering a printer and associated track system by an electrical grid;
   d. as long as manufacturing conditions are met, printing a wide, flat and continuous array of solar cells;
   e. continuously or intermittently conveying printed PV ribbon to its track (horizontal or vertical) to convey with the track the wide, flat and continuous array of solar cells away from the PV manufacturing site and into a sun-lit area;
   f. routing power from sun-exposed wide, flat and continuous array of solar cells to power the PV manufacturing site and track system while the wide, flat and continuous array of solar cells generate power;
   g. while manufacturing, and while the wide, flat and continuous array of solar cells provides insufficient power to power the PV manufacturing site and the track system, using grid power to supplement the power to the PV manufacturing site and track system;

h. while not manufacturing, routing power from sun-exposed wide, flat and continuous array of solar cells to the grid; and i. while manufacturing, and while the wide, flat and continuous array of solar cells provides sufficient power to power the PV manufacturing site and the track system, use wide, flat and continuous array of solar cells-generated power to power the printer, track system, and associated circuits and communications and route excess power from wide, flat and continuous array of solar cells.

10. The method according to claim 9, wherein the wide, flat and continuous array of solar cells is 50-200 feet wide.

11. The method according to claim 9, wherein substrate for the wide, flat and continuous array of solar cells is 500 feet to 20 miles long.

12. The method according to claim 9, wherein the wide, flat and continuous array of solar cells is 500 feet to 20 miles long.

13. The method according to claim 9, wherein the wide, flat and continuous array of solar cells track system hangs the wide, flat and continuous array of solar cells substantially vertically in the sun-lit region and permits the distal end of the wide, flat and continuous array of solar cells to move away from the PV manufacturing site as additional substrate is PV printed and conveyed into the sun-lit region.

14. The method according to claim 13, wherein the track system turns at a distal end to convey the wide, flat and continuous array of solar cells back to the PV manufacturing site while still exposed to the sun in the sun-lit region.

15. The method according to claim 9, wherein the wide, flat and continuous array of solar cells track system supports the wide, flat and continuous array of solar cells in a substantially horizontal orientation in the sun-lit region and permits the distal end of the wide, flat and continuous array of solar cells to move away from the PV manufacturing site as additional substrate is PV printed and conveyed into the sun-lit region.

16. The method according to claim 15, wherein the track system turns at a distal end to convey the wide, flat and continuous array of solar cells back to the PV manufacturing site while still exposed to the sun in the sun-lit region.

17. The method according to claim 9, wherein the PV manufacturing site PV prints the wide, flat and continuous array of solar cells.

* * * * *